Figure 1:
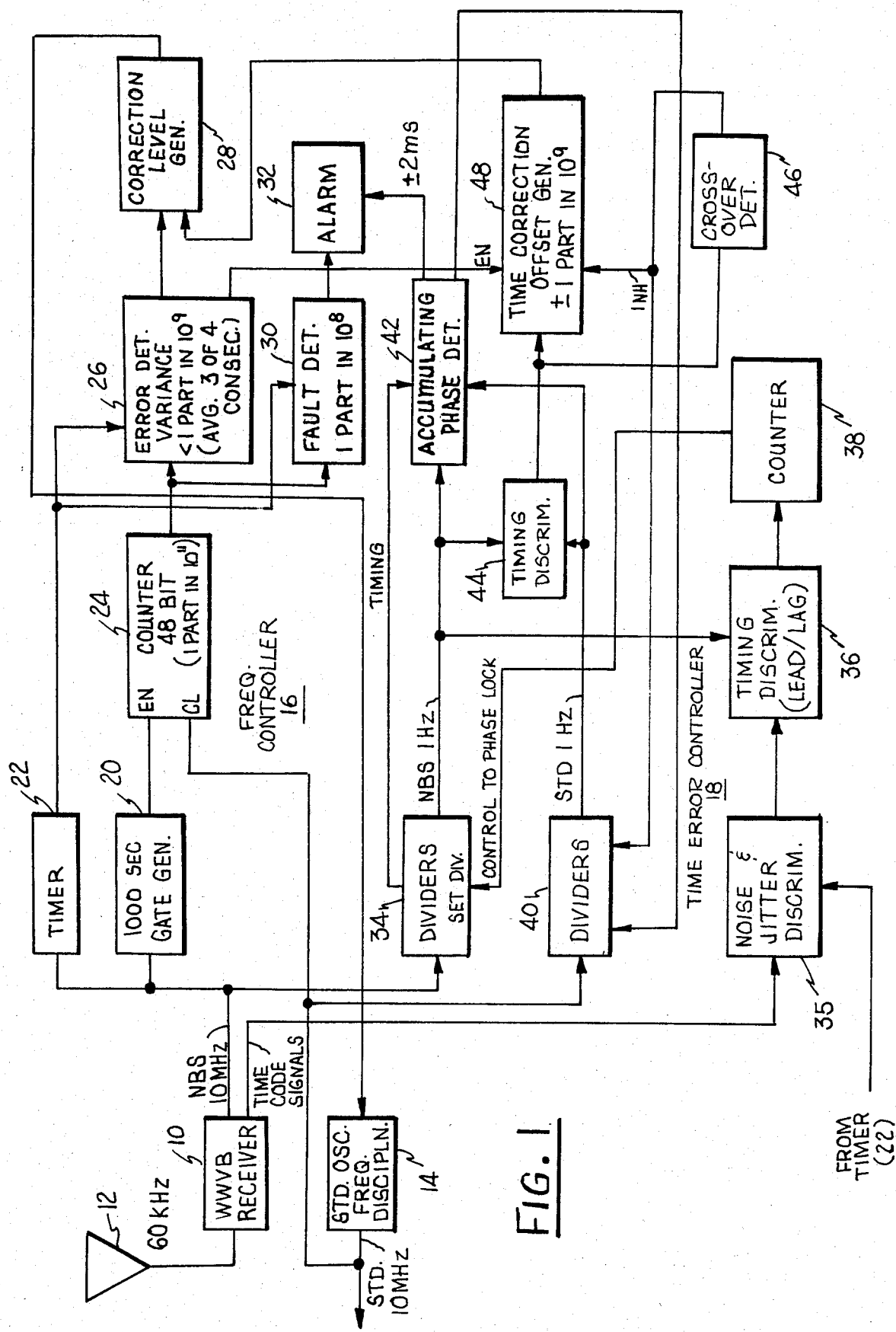

United States Patent [19]

Hesselberth et al.

[11] Patent Number: 4,525,685
[45] Date of Patent: Jun. 25, 1985

[54] DISCIPLINED OSCILLATOR SYSTEM WITH FREQUENCY CONTROL AND ACCUMULATED TIME CONTROL

[75] Inventors: Robert J. Hesselberth, Penfield; Thomas P. Donaher, Rochester; Joel E. Sandahl, Fairport, all of N.Y.

[73] Assignee: Spectracom Corp., East Rochester, N.Y.

[21] Appl. No.: 499,737

[22] Filed: May 31, 1983

[51] Int. Cl.³ .............................................. H03L 7/06
[52] U.S. Cl. ......................................... 331/10; 331/11; 331/18; 331/25; 331/64; 368/47; 375/111
[58] Field of Search ................... 331/10, 11, 18, 25, 331/64; 368/47; 375/111

[56] References Cited

U.S. PATENT DOCUMENTS

| | | | |
|---|---|---|---|
| 3,731,210 | 5/1973 | Mollod | 331/10 X |
| 3,890,619 | 6/1975 | Mounce | 343/385 |
| 4,105,946 | 8/1978 | Ikeda | 331/10 X |
| 4,161,734 | 7/1979 | Anderson | 343/450 X |
| 4,184,122 | 1/1980 | Clark et al. | 328/133 |
| 4,215,308 | 7/1980 | Kusters | 324/78 D |
| 4,264,967 | 4/1981 | Fujita et al. | 368/156 |
| 4,303,893 | 12/1981 | Goldberg | 331/1 A |
| 4,305,041 | 12/1981 | Frerking | 328/155 |
| 4,305,045 | 12/1981 | Metz et al. | 331/25 X |
| 4,313,217 | 1/1982 | Beuscher | 455/226 |

Primary Examiner—Eugene R. Laroche
Assistant Examiner—O. C. Mis
Attorney, Agent, or Firm—Martin LuKacher

[57] ABSTRACT

A disciplined oscillator system having a standard oscillator which is automatically corrected for both frequency errors and time error accumulation to a constant frequency signal which is derived from the WWVB carrier frequency and the WWVB TIME CODE to maintain overall frequency accuracy within one part in $10^9$ notwithstanding oscillator aging and in spite of jitter and distortion due to propagation delays and noise which may cause loss of, or time jitter in, the WWVB signals. Frequency errors are detected through the use of a counter (24) having a measurement accuracy greater than one part in $10^{10}$. An error detector (26) derives correction signals by averaging a plurality of frequency variances obtained in successive measurement cycles. Timing errors are corrected by dividers (34, 40) controlled by a timing discriminator (36) which responds to timing variance between signals from the standard oscillator and from the WWVB reference which are phase locked to those TIME CODE signals which are substantially free of noise and jitter. The timing correction is inhibited after the standard oscillator is corrected. Frequency correction is applied continuously.

39 Claims, 4 Drawing Figures

DISCIPLINED OSCILLATOR SYSTEM WITH FREQUENCY CONTROL AND ACCUMULATED TIME CONTROL

DESCRIPTION

The present invention relates to systems for providing signals with highly stable constant frequency, sometimes called frequency standards, and particularly to systems where high stable signals are obtained from an oscillator, the stability in frequency and/or time is controlled by a reference signal having known precision, which oscillator may be called a disciplined oscillator.

The invention is especially suitable for use in providing frequency standard or precision time-base standard signals having their stability traceable to a reference frequency obtained from a broadcast transmission, particularly the transmissions of the National Bureau of Standards (NBS) reference frequencies and TIME CODE signals which are transmitted by radio station WWVB. The invention is also applicable for use with reference frequencies obtained from other sources, such as via satellite transmissions and from master reference sources which may be cesium or other atomic standards. When NBS and WWVB are mentioned, such mention should be taken to mean equivalent transmissions, such as from radio station MSF in England, which is operated by the British Government.

Standard frequency sources have been provided with local, highly stable oscillators. The outputs of these oscillators may be compared with signals phase locked to signals received from WWVB and deviations recorded so as to make errors visible and correctable by manual control from time to time. The NBS frequency standard receiver model 8161 available from Spectracom Corporation, Rochester, N.Y. provides such a standard frequency source with precision traceable to NBS. Disciplined oscillator systems have also been available which are phase locked to external reference signals such as derived from atomic standards (usually cesium). The standard oscillators which are disciplined are themselves highly stable. The frequency errors with respect to the reference frequency are due principally to long term phenomena, such as aging of components in the oscillator. Deriving corrections of frequency and timing in the long term, over long periods of time, so as to maintain stability to extremely high resolutions, for example one part in $10^9$ or better, is extremely difficult, particularly when the components used may result in long term errors of similar magnitude. The problem is exacerbated when the reference signals come from broadcast transmissions, such as the NBS WWVB transmission. Propagation delays and noise perturb these transmissions making it difficult to obtain reliable reference signals.

Accordingly it is a principal object of the present invention to provide an improved disciplined oscillator system wherein a standard oscillator is automatically and continuously adjusted to maintain a standard frequency output in accordance with a reference signal.

It is another object of the present invention to provide an improved disciplined oscillator system, the output signal of which is maintained highly stable in frequency and timing with respect to a broadcast reference signal, such as the NBS WWVB transmission.

It is a still further object of the present invention to provide an improved disciplined oscillator system which automatically compensates a standard oscillator, which is itself highly stable, in frequency to the precision of a reference signal on a long term basis.

It is a still further object of the present invention to provide an improved disciplined oscillator system which makes use of a microprocessor in deriving frequency and/or timing error signals for controlling the oscillator to maintain it stable in frequency with respect to a reference signal automatically and continuously over long periods of time.

It is a still further object of the present invention to provide an improved disciplined oscillator system having a standard oscillator which is automatically adjusted in accordance with received broadcast reference signals, such as signals broadcast by the NBS WWVB station, which maintains its frequency accuracy in spite of the absence of reliable transmissions of the reference signal from time to time.

Briefly described, a disciplined oscillator system embodying the invention includes a standard frequency oscillator for providing a standard frequency output and having an input for controlling the frequency thereof. Frequency controller means are responsive to constant frequency signals, which may include pulses which are repetitive at fixed intervals of time. These signals may be derived from a receiver which is phase locked to broadcast reference frequency signals which may include pulses, such as represent time codes, which are repetitive at fixed intervals of time (e.g., each second). The frequency controller may include a counter having capacity to count a number greater than the resolution in frequency to which the standard frequency output is to be controlled. Means responsive to the constant frequency signals, repetitively enable the counter to count the standard frequency output during successive intervals, each of length sufficient to count a number of cycles of the standard frequency output at least equal to the desired frequency resolution. Means responsive to the counts stored in the counter, for example a microprocessor, processes the counts to provide the frequency control signal which is applied to frequency control input of the oscillator. The system may include time controller means which are responsive to the fixed interval (time code) pulses for detecting time displacements of the standard frequency output with respect to these pulses for providing a timing control signal. The timing controller means makes use of means responsive to the constant frequency signals and the pulses for providing a train of reference pulses, phase locked to the fixed interval pulses. The timing control signals are obtained by means responsive to the phase difference between the fixed interval pulses and the reference pulses. Only fixed interval (TIME CODE) pulses which are substantially free from jitter and noise perturbations are utilized to develop the timing control signals. These signals are applied to the frequency control input of the standard oscillator until the removal of timing errors from the standard frequency output is detected in response to the phase difference between the fixed interval pulses and the reference pulses. Then, the frequency control means continues to provide long term stability in the standard frequency output. The disciplined oscillator is thereby provided with a stability of one part in $10^9$ on a long term basis.

Figure 2A:
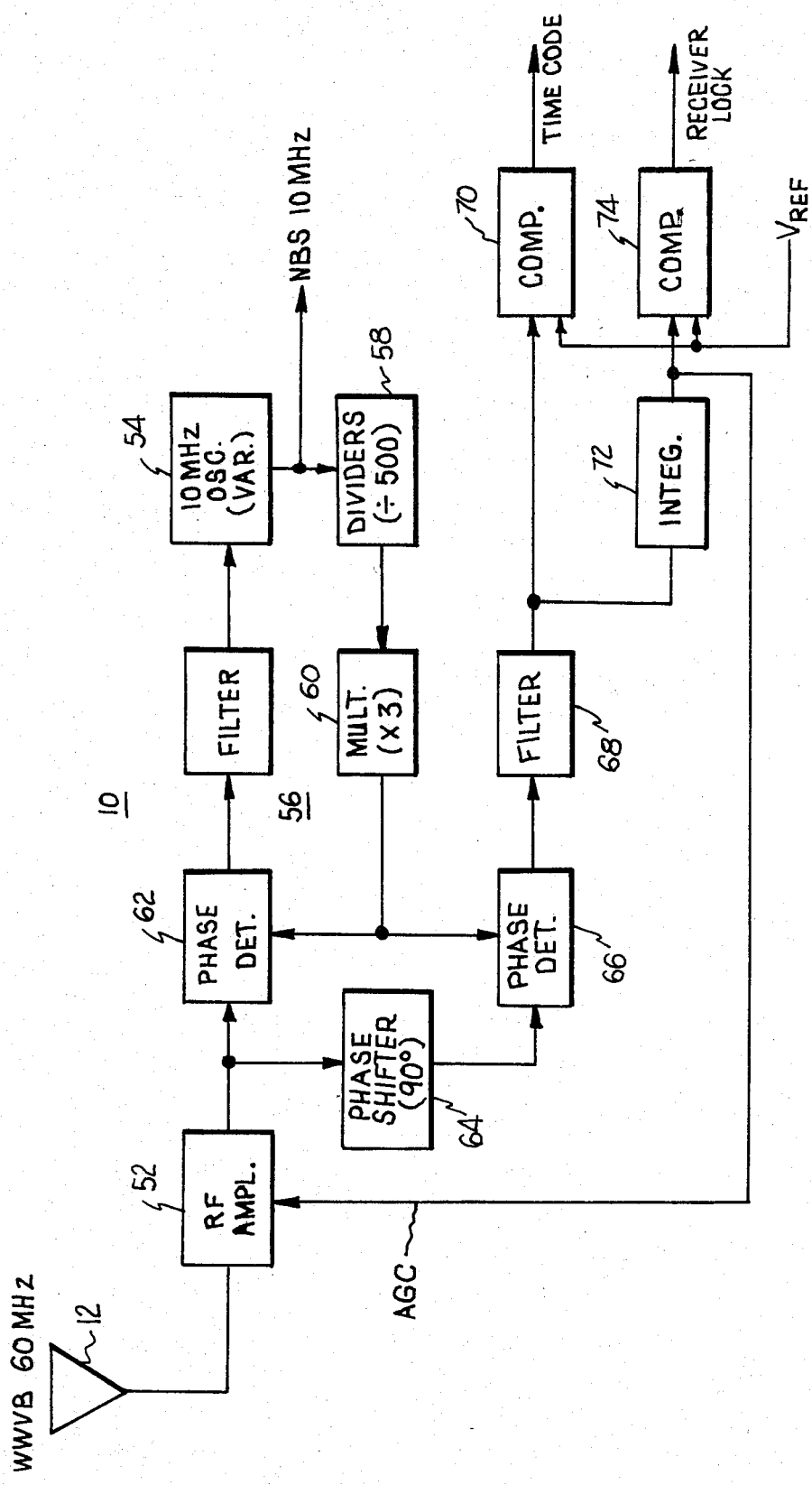
Figure 2B:
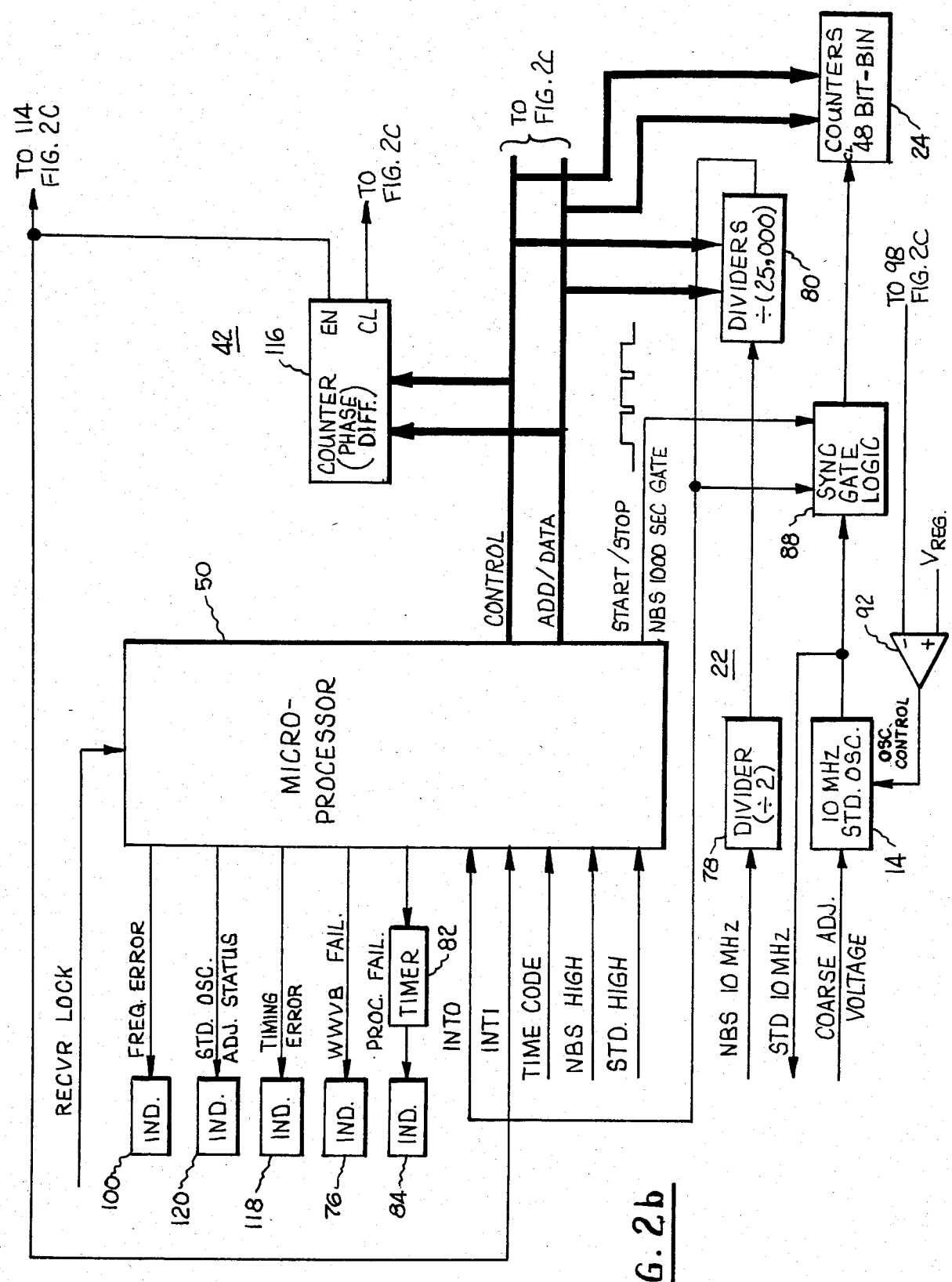
Figure 2C:
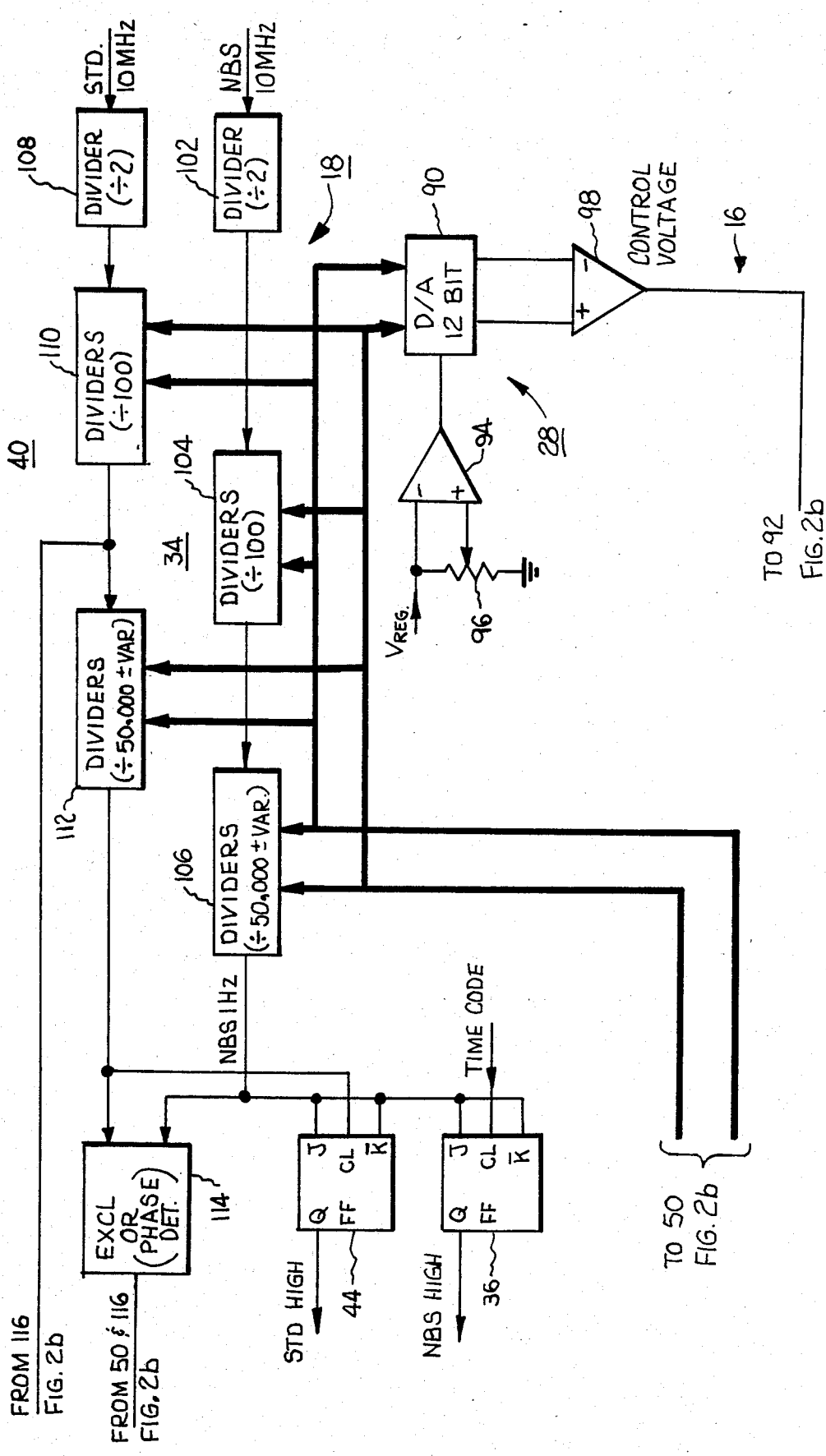

The foregoing and other objects, features and advantages of the invention as well as a presently preferred embodiment thereof, will become more apparent from a reading of the following description in connection with the accompanying drawings in which:

FIG. 1 is a block diagram illustrating a frequency disciplined oscillator system embodying the invention;

FIG. 2A-C is a more detailed block diagram of the system shown in FIG. 1, which is microprocessor based.

Referring first to FIG. 1, there is shown a WWVB receiver 10 connected to an antenna 12 which receives the 60 KHz WWVB transmission. The receiver provides a reference output, which is phase locked to the NBS transmission, in the form of a 10 MHz signal called NBS 10 MHz. The receiver also demodulates the TIME CODE signals which are transmitted by a reduction in the 60 KHz carrier level each second. These TIME CODE signals are pulses either 200, 500 or 800 milliseconds in duration (wide). The 200 millisecond pulse represents a logical zero bit. The 500 millisecond pulse represents a logical one bit and the 800 millisecond pulse represents a position identifier. The TIME CODE signals may be used to derive the time of day and day of the year. They are used in accordance with this invention for time error control purposes. The design of the receiver 10 may be similar to the Spectracom 8161 frequency standard receiver.

The system also uses a standard oscillator 14 which is frequency disciplined. This oscillator provides a standard 10 MHz output frequency which is maintained accurate to a high degree of precision at least one part in $10^9$. The oscillator 14 is disciplined or adjusted with control signals derived with respect to the NBS reference transmitted by WWBB. This reference is accurate to within one part in $10^{11}$. Day to date deviations in frequency are nominally less than one part in $10^{12}$. However, changes in the propagation medium, for example, with atmospheric and stellar conditions, result in fluctuations in the WWVB carrier which are received by the receiver 10 that may be much greater than the inherent accuracy of the NBS reference. The disciplined oscillator system accommodates for such uncertainty in the standard in large measure. The oscillator 14 is a quartz crystal oscillator which may be contained in a temperature controlled oven. Its circuit includes a variable reactance element (e.g. a varactor diode) which enables the frequency to be varied over a range sufficient to overcome the long term instability of the oscillator. The oscillator has good short term stability, but may vary in frequency over the long term (a day or more). The frequency may be adjusted over a ten Hz range for example by the control signal, which is inputted to the oscillator 14. The oscillator may be of a design used in the Spectracom 8161 standard frequency source.

The control signals for disciplining the oscillator 14 are obtained from a frequency controller 16 and also from a time controller 18. While the system preferably includes both the frequency controller 16 and the time controller 18, the standard oscillator 14 may obtain its control signals either from the frequency controller 16 or the time error controller 18 alone. When the system is provided without the time error controller 18, frequency controller will continue to be provided, but without correction for variances of the standard 10 MHz output from the oscillator 14 with respect to the TIME CODE signals.

In the frequency controller 16, the NBS 10 MHz signal is used to operate a gate generator 20 which generates a gate signal of 1000 seconds in duration. This gate signal is synchronous with a timing signal derived from the NBS 10 MHz signal by a timer 22. This timing signal is suitably a pulse which is repetitive at 5 millisecond intervals. The gate signal from the generator 20 is synchronous with these timing pulses. Each gate is separated from its succeeding gate by the portion of 5 milliseconds between the end of the preceding 1000 second gate and the beginning of the succeeding 1000 second gate. Thus, the gate has a relatively long duty cycle. A counter 24 is enabled by the 1000 second gate and is clocked by the STD 10 MHz signal from the standard oscillator 14. The counter 24 has a count capacity at least equal to the resolution to which the frequency is to be controlled in order to provide a resolution of one part in $10^{10}$, a 48 bit binary counter, which is capable of counting more than 10 billion cycles of the STD 10 MHz signal, is used. The counter 24 thus provides a resolution exceeding one part in $10^{11}$. The lower order (least significant) bit of the counts stored in the counter after each 1000 second gate, thus represent variances in the frequencies of the STD 10 MHz signal.

An error detector 26, the operation of which is timed by the timer signals interrogates the counter for variances exceeding one part in $10^9$ in a plurality, suitably four, consecutive 1000 second gates. If the variance is one part in $10^9$ or less, the three variances are averaged and the output is applied to a correction level generator 28. It will be appreciated that 10 million cycles of the STD 10 MHz signal are presented for counting in the counter 24 during each 1000 second gate. The variance is represented by the difference in the count from exactly 10 million. Only if variances on consecutive gates are one part in $10^9$ or less is the error used to obtain a frequency correction signal in the correction level generator 28. For larger corrections, which exceed one part in $10^8$, a fault detector 30 is actuated which operates an alarm 32 to indicate that the frequency of the STD 10 MHz signal is in error by more than one part in $10^8$. The operator may then attempt to control the frequency of the standard oscillator 14 manually. Alternatively, the fault detector may operate a switch (not shown) to switch over the output of the system to a standby or auxilliary disciplined system. Two disciplined oscillator systems may be used, one backing up the other, in the interest of enhancing reliability.

The correction level generator 28 suitably includes a digital to analog (D/A) converter which translates the digital error signal from the counter 24 into the frequency control signal. In the case of the illustrated system, where the standard oscillator 14 has a 10 Hz tuning range subject to correction by signals derived during the 1000 second gate, the resolution of the correction is 10,000 parts. The D/A converter in the generator 28 may suitably be a 12 bit multiplying digital to analog converter. The error signal may be processed so that each of the 4,096 or $2^{12}$ possible increments in the analog output are related to the 10,000 possible parts by multiplying the measured error by 4096 and dividing their product by 10,000. This processing may be carried out by discrete logic elements or in a microprocessor. The frequency correction signal may vary incrementally to a small extent, since it is indicated by the counts stored in the counter 24 during consecutive 1000 second intervals. The adjustment in the frequency of the standard oscillator 14, therefore, occurs slowly and in a manner to make up for the long term frequency variations in its STD 10 MHz output. By utilizing readings (stored counts) from the counter 24 only when three out of four consecutive readings (over a interval exceeding 4000 seconds) which have variances of one part in $10^9$ or less and then only the average of such readings, the average error in the STD 10 MHz signal is obtained fully to a resolution of one part in $10^{10}$, which is the full resolution capacity of the frequency controller 16 obtainable by counting a 10 MHz signal during a 1000 second gate.

The time error controller 18 uses a first chain of dividers 34 which divides the NBS 10 MHz signal down to a 1 Hz signal called NBS 1 Hz. The TIME CODE signals are processed in a noise and jitter discriminator 34 so as to obtain pulses each second which are substantially free from noise and jitter due to propagation delays, interference and inter-symbol distortion. The TIME CODE signals repeat at fixed intervals of one second and may be referred as fixed interval signals. NBS 1 Hz is derived from the NBS WWVB transmissions and may be referred to as reference pulses. The TIME CODE, fixed interval pulses which are reliable indications of the one second timing, which is accurate to the NBS transmission, are selected by the discriminator 35. Pulses which jitter due to inter-symbol distortion are eliminated by selecting only the TIME CODE pulses which follow a logical zero (the fixed interval of one second when a 200 millisecond pulse is transmitted). When a preceding TIME CODE pulse is a logical one (500 milliseconds), or a PID (800 milliseconds), it is not used and the operation of the time error controller is not dependent thereon. The leading edge of the TIME CODE pulse is exactly at the one second intervals. The only pulses having precisely defined edges are used to discriminate against noise and jitter. In the discriminator 35 the TIME CODE pulses may be sampled every 5 milliseconds with timing pulses from the timer 22. Only if there are a given number, say 16, samples of one polarity followed by 16 samples of the opposite polarity (16 low samples followed by 16 high samples), is a TIME CODE pulse selected. The discriminator 35 may also count the number of good pulses for use in operation of the controller 18.

A timing discriminator 36 detects the relative time displacement between the fixed interval TIME CODE pulses and the NBS 1 Hz pulses. The dividing ratio in the dividers 34 is changed in accordance with the time relationship between the NBS 1 Hz and the fixed interval TIME CODE pulses so as to phase lock the NBS 1 Hz to the fixed interval TIME CODE pulses. A number of outputs from the timing discriminator 36 are counted in a counter 38. The counter may be an up down counter. If after this number of counts, corresponding to several repetitions of the 1 Hz signals, the number of outputs from the discriminator 36 indicates a leading or early relationship of NBS 1 Hz to the fixed interval TIME CODE pulses, the dividing ratio is increased so as to make the NBS 1 Hz pulses arrive later in time. Conversely, if the count in the counter represents a lagging relationship the dividing ratio is decreased so as to make the NBS 1 Hz pulses arrive earlier. In the interest of rapidly bringing the NBS 1 Hz into phase lock with the fixed interval TIME CODE signals, the number of 1 Hz repetitions (the number of seconds) when the counter 38 counts the outputs of the timing discriminator 36 may be varied. A good pulse counter in the discriminator 35 may set the number, initially for a low number of good pulses, after which time the dividing ratio may be changed maximally to delay or advance the NBS 1 Hz pulses by a maximum period of time.

Then, as the delay or advance of the NBS 1 Hz exceeds that which is required to bring about phase lock with the TIME CODE fixed interval signals, the sense of the output of the timing discriminator 36 will change, for example from a lagging condition to a leading condition. This change or cross-over is utilized to increase the number of good pulses which must be counted in the counter 38 before the dividing ratio in the divider 34 is altered. The dividing ratio is then changed by a smaller amount. The process continues with each cross-over until a very large number of 1 Hz pulses, for example over 1000, is counted in the counter 38 until a change of the dividing ratio in the dividers 34 is effected. Ultimately, the change in dividing ratio must be in its lowest order digit corresponding to a very small advance or delay (20 microseconds as will be apparent hereinafter from FIG. 2) as phase lock is reached the dividing ratio may change by one increment in the lowest order digit each time the very large number of good time code pulses is counted.

Upon phase lock, the dividing ratio of the dividers 34 is transferred to another divider chain 40 which divides the STD 10 MHz signals from the standard oscillator 14 down to 1 Hz signals, called STD 1 Hz. Preferably the dividing ratio of the dividers 40 is set by means of an accumulating phase detector 42 which accumulates timing pulses obtained from the dividers 34 which may be repetitive at 20 microsecond intervals. The dividing ratio is changed opposite senses depending upon whether the NBS 1 Hz signal is leading or lagging the STD 1 Hz signal. The accumulated phase error is transferred to the dividers 40 at the time of a cross-over from a leading to lagging condition of the NBS 1 Hz and STD 1 Hz signals derived by another timing discriminator 44 and a cross-over detector 46 which responds to the sense of the output of the timing discriminator 44. It is preferable to use the accumulating phase detector 42 to set the dividers 40 which produce the STD 1 Hz instead of transferring the dividing ratio which is set into the dividers 34 which produce the NBS 1 Hz, since the latter dividing ratio changes from time to time. The output of the accumulating phase detector may also be used to detect if there has been a gain or loss of more than plus or minus 2 milliseconds in the timing of the NBS 1 Hz with respect to the STD 1 Hz. Then the alarm 32 is activated. The alarm 32 is inhibited until the dividing ratio is set into the STD 1 Hz dividers 40.

A time correction offset generator provides an incremental time correction corresponding either to plus or minus one part in $10^9$ of the frequency of the standard oscillator 14 depending upon whether the timing discriminator 44 indicates that the NBS 1 Hz is lagging or leading the STD 1 Hz. This incremental timing correction is applied to the correction level generator 28 after the error detector 26 inputs a frequency error correction output to the correction level generator 28. Then the time correction offset generator 48 is enabled. The frequency of the standard oscillator 14 is controlled by the time correction signal generated in the correction level generator 28. Eventually the cross-over detector 46 will detect a cross-over when the time relationship between the STD 1 Hz and NBS 1 Hz changes. The time correction offset generator is then inhibited since the time errors have been substantially removed from the standard oscillator and it is time coherent with the TIME CODE signals and to the accuracy of the NBS transmission.

The disciplined oscillator system is preferably microprocessor based, utilizing a microprocessor 50 to implement or control the components of the disciplined oscillator system. The microprocessor based disciplined oscillator system is illustrated in FIG. 2.

The WWVB receiver 10 and the antenna 12, which is connected to the input thereof, is also shown in FIG. 2. The 60 KHz signal is amplified in a radio frequency (RF) amplifier 52. A 10 MHz variable frequency oscillator 54, which may be a voltage controlled oscillator, is contained in a phase locked loop 56. The NBS 10 MHz output is obtained from the oscillator and is phase locked by the loop 56 to the 60 KHz WWVB signal. In the loop 56, the NBS 10 MHz signal is divided to 20 KHz by dividers 58 which divide by 500. The NBS 10 MHz is shaped into a pulse waveform, as by being applied to a comparator or a logic gate connected as a comparator, before being applied to the dividers 58. The 20 KHz output from the dividers 58 is multiplied by three in a multiplier circuit 60, which may be a non-linear multiplier having tuned output circuits. The 60 KHz signal from the multiplier 60 is compared with the WWVB 60 KHz signal in a phase detector 62. The phase detector 62 may be an integrated circuit quadraphase detector which provides synchronous detection of the 60 KHz carrier.

The output from the RF amplifier 52 is phase shifted 90° in a phase shifter 64 and is applied to another phase detector 66 of the same type as the detector 62. The output level from this phase detector 66 is proportional to the level of the incoming carrier and, thus, provides the basis for TIME CODE amplitude detection and automatic gain control (AGC) voltage generation. A low pass filter 68 passes the demodulated signal containing the TIME CODE pulses to a comparator 70 which derives the TIME CODE pulses by comparison with a reference voltage. There may be an inversion in the comparator 70 such that the TIME CODE pulses are high for their respective durations, 200 milliseconds for a logical 0, 500 milliseconds for a logical 1, and 800 milliseconds for a position identifier. The leading edges of these pulses recur at one second intervals as precisely set by the NBS WWVB transmission. The TIME CODE pulses which are valid and which are used in the time error controller 18 to derive the timing control signal are those with a "good" leading edge, and not pulses where a leading edge is distorted by noise. The TIME CODE pulses which are used are also those which are not subject to timing instability due to intersymbol distortion. The symbols are the successive TIME CODE pulses transmitted each second. To minimize the effects of intersymbol distortion, only the pulses which are preceded by periods having minimum width are used. These are the pulses which follow a logical 0 or 200 millisecond transmission. The TIME CODE from the comparator 70 is an input into the microprocessor 50 which provides the noise and jitter discriminator 34 by selecting for use in the operation of the time error controller 18 only those pulses which are substantially free of noise, have good edges, and follow a logical 0 representing TIME CODE pulse.

The AGC voltage is derived by an integrator 72. Because the AGC voltage is derived from the output of the quadrature phase detector 66, it is present only after phase lock is achieved in the loop 56. After phase lock, the gain of the RF amplifier 52 is reduced to a level just sufficient to provide a reference for the phase locked loop 56, thereby preventing saturation or overdriven stages during strong signal conditions. The AGC voltage from the integrator 72 is applied to a comparator 74 and compared with the reference voltage VREF to provide an output representing receiver lock. This output is also inputted to the microprocessor 50, which outputs a WWVB failure signal to an indicator 76 in the event that the WWVB carrier or some component in the receiver 10 fails and the receiver lock output does not appear for a given period of time, for example, 5 minutes.

The microprocessor, which is used, is preferably an integrated circuit device, although any computer with sufficient processing capacity may be used such as the Intel 8031. External memory chips are connected to and may be considered for purposes of the present explanation of the invention, a part of the microprocessor 50. The processor 50 has inputs connected to control lines and to an address and data bus (ADD/DATA). At power on the dividers and counters, except for the divide by 2 dividers, are reset to 0 or to their nominal dividing ratios. The dividers are suitably integrated circuits having latches which hold presets which establish their dividing ratios.

The 48 bit binary counter 24 in the frequency controller 16, is initially reset to 0 on power on and thus readied to participate in the generation of the frequency control signal for adjusting the 10 MHz standard oscillator 14. System timing is established by interrupts (INTO) from the timer 22 wherein the NBS 10 MHz signal is divided down to 200 KHz by a divide by 2 divider 78 and a divide by 25,000 divider 80. The resulting 200 Hz signal interrupts the processor 50 once per period (5 milliseconds). Self-test circuits in the processor 50 respond to the interrupt and reset a timer 82. If the timer times out, say after 2 seconds, an indicator 84 will show processor failure.

The processor generates the NBS 1,000 second start/stop gate signal by maintaining a software divider responsive to INT0. The gate signal consists of 1,000 second pulses separated by short gaps approximately 1 second wide as shown at 86 in FIG. 2b. The timing pulses and the 1,000 second gate signal are applied to synchronous gate logic 88. Flip flops and gates in the logic 88 are combined to enable the passage of the STD 10 MHz signal from the standard oscillator 14 during the period of the NBS 1,000 SEC gate which occurs immediately after a timing pulse. The repetitions or cycles of the STD 10 MHz signal are then presented for counting in the counters 24 for successive thousand second intervals. Inasmuch as the counter has a 48 bit capacity, it can store 2.8 times $10^{14}$ counts, which is well in excess of the $10^{10}$ cycles of STD 10 MHz which nominally occur during the 1,000 second gate. The lower order bits of the count stored in the counter 24 at the end of each 1,000 gate counting interval represent the variance in the frequency of the standard oscillator 14. Control signals from the microprocessor enable the reading of the counters 24 after each 1,000 second gate, such that consecutive readings are stored in the microprocessor.

The microprocessor 50 has means for determining the frequency error and provides the function of the error detector 26. In the microprocessor 50, 4 consecutive readings are compared, each with all others. If three out of four of such readings have a variance of less than one part in $10^9$, the four readings are averaged and an output 12 bit digital word having a resolution to 2.44 parts in $10^{10}$ is applied via the ADD/DATA bus to a 12 bit digital to analog converter 90 which is part of the correction level generator 28.

Calibration or oscillator control voltages for varying the frequency of the standard oscillator 14 over its 10 Hz tuning range are obtained with the aid of operational amplifiers 92 and 94. The oscillator 14 is preferably set so that its maximum tuning frequency is 2.5 Hz above 10 MHz and its minimum is 7.5 Hz below 10 MHz. This is because the frequency of the standard oscillator 14 tends to increase with aging. A reference voltage from a source of regulated voltage (VREG) provides an offset voltage to the oscillator control input of the standard oscillator 14 via the operational amplifier 92. This offset is sufficient to tune the oscillator to its maximum tuning frequency. The same VREG voltage is limited by a potentiometer 96 connected to the operational amplifier 94 to a reference voltage representing tuning to 2.5 Hz below the maximum, thereby providing the tuning range from 2.5 Hz above 10 MHz to 7.5 Hz below MHz. The digital-to-analog converter 90 is a multiplying converter, of the type which is commercially available, which multiplies the value of the 12 bit digital word which is applied thereto from the microprocessor 50 by way of the ADD/DATA lines into a corresponding current output. This current output is converted into a tuning control voltage by another operational amplifier 98. Feedback to the D/A 90 is provided for stabilization.

The microprocessor 50 divides the average value of the three frequency variances which are read from the counters 24 into $2^{12}$ parts by computing the product of this average, multiplying by $2^{12}$ or 4096, and dividing by 10,000. In the event that the variance of 3 consecutive readings from the counters 24 exceeds one part in $10^9$, the previous value for adjustment of the tuning of the standard oscillator 14 is maintained. Accordingly, large variances in frequency which are not compatible with the slow changes in frequency which the system is designed to automatically correct are ignored. In the event that a large variance, greater than 1 part in $10^8$, is read from the counter after any 1,000 second gate, the processor 50 recognizes a frequency error and provides an output to an alarm indicator 100.

In the event of a frequency error, a coarse adjusting voltage may be applied to the standard oscillator 14 or the limit control potentiometer 96 may be adjusted to bring the oscillator 14 into tuning range, under manual control. If the frequency error continues, an alarm and switchover to an ancillary system may be effected, as by a timer connected to the frequency error output which is not reset by the removal of the frequency error output after a predetermined period of time, for example five minutes.

The timing controller 18, like the frequency controller 16, is microprocessor based; using the microprocessor 50 in the generation of the timing control signal. The NBS 1 Hz phase locked to the TIME CODE makes use of dividers 102, 104 and 106, which constitute the dividers 34. The NBS 10 MHz signal is divided by 2 in the divider 102, by 100 in the divider 104 and by a variable divisor, nominally 50,000 to produce the NBS 1 Hz signal. A flip flop provides the time discriminator 36. The TIME CODE, fixed interval pulses clock the flip flop 36, sampling the NBS 1 Hz. The Q output of the flip flop indicates whether the NBS 1 Hz is early or late with respect to the TIME CODE fixed interval pulses. This Q output is called NBS HIGH. NBS HIGH is an input to the microprocessor 50.

The dividers 104 and 106 are preset by inputs from the microprocessor 50 which are applied thereto via the ADD/DATA bus. On power up, the divider 104 is preset to divide by 100 and latched by internal latches to retain that dividing ratio. The preset to the dividers 106 is variable to maintain phase lock between the NBS 1 Hz and the TIME CODE fixed interval pulses.

A table-driven search algorithm involving the use of the microprocessor 50 obtains phase lock of the NBS 1 Hz reference signal to the leading edge of the fixed interval TIME CODE pulses. Only selected TIME CODE pulses having good edges are used. Such edges are detected by a sampling algorithm in the microprocessor 50. The TIME CODE pulses from the comparator 70 in the receiver 10 are sampled every five milliseconds (upon reoccurrence of INTO). If there are 16 low samples followed by 16 high samples (it will be recalled that the TIME CODE pulses in the comparator 70 are high), the criteria for a good edge is satisfied. Even if a good edge is detected, to minimize the effect of intersymbol interference, only good edges that follow a logical 0 in the TIME CODE are used in time locking of NBS 1 Hz to TIME CODE.

If NBS HIGH is high, then TIME CODE is lagging the rising edge of NBS 1 Hz. Similarly, if NBS HIGH is low, then TIME CODE is leading the rising edge of NBS 1 Hz. A low/high counter is incremented if NBS HIGH is high, upon occurrence of each TIME CODE pulse having a good edge, and decremented if NBS HIGH is low on occurrence of each such good edge. The number of good edges examined before the dividing ratio in the dividers 106 is changed is determined from an entry in the following time lock table.

| | TIME LOCK TABLE | | |
|---|---|---|---|
| LEVEL | GOOD EDGE | STEP SIZE | STEP TIME |
| 0 | 9 | 15,536 | 310.72 msec |
| 1 | 17 | 8,192 | 163.84 msec |
| 2 | 33 | 4,096 | 81.92 msec |
| 3 | 65 | 2,048 | 40.96 msec |
| 4 | 129 | 1,024 | 20.48 msec |
| 5 | 257 | 512 | 10.24 msec |
| 6 | 513 | 256 | 5.12 msec |
| 7 | 1,025 | 128 | 2.56 msec |
| 8 | 2,049 | 64 | 1.28 msec |
| 9 | 2,049 | 32 | 640 usec |
| A | 2,049 | 16 | 320 usec |
| B | 2,049 | 8 | 160 usec |
| C | 2,049 | 4 | 80 usec |
| D | 2,049 | 2 | 40 usec |
| E | 2,049 | 1 | 20 usec. |

In the table there are 15 levels or steps in the algorithm. Each level correspond to a number of good edges which must be accumulated before action in presetting the dividing ratio of the dividers 106 is taken. The step size is the increase or decrease in dividing ratio from 50,000. The step time is the advance or delay of the NBS 1 Hz as a result of the change in dividing ratio. At power on, the process starts at level 0 and NBS HIGH is sampled for 9 good edges. If the majority of the 9 samples are high, it is determined that the TIME CODE was lagging the rising edge of NBS 1 Hz and the divide ratio is increased by a step size of 15,536 or a step time of 310.72 milliseconds (msec). This divide ratio is maintained for at least one count cycle (9 edges for Level O). This majority vote may be implemented by an up/down counter which counts the low and high NBS high outputs of the flip-flop time discriminator 36. If the low/high counter is high after being incremented by the number of good edges indicated in the table, the step size is either increased or decreased by increasing or decreasing the preset divide ratio in the dividers 106. The process remains at level 0 until a cross over occurs, that is the output of the low/high counter changes polarity at the end of the next group of samples, which are 9 good edges for level 0. When a cross over occurs, the pointer into the time lock table is incremented and the level is increased from 0 to 1, and the number of good time code edges at which sampling occurs is increased from 9 to 17. The step size is also decreased. After every cross over the level is increased and the step size is decreased.

The process continues until level E is reached. Now the step size is 20 microseconds and the dividing ratio is changed only by one count. This is one cycle of the NBS 10 MHz divided by 200 in dividers 102 and 104 (50 KH$_3$). Once level E is reached and there are three cross overs, a time lock is indicated. Upon time lock, the divider chain 40 which produces STD 1 Hz from STD 10 MHz is adjusted so that STD 1 Hz is in phase with NBS 1 Hz. This is a one time adjustment, such that henceforth the phase relationship between STD 1 Hz and NBS 1 Hz will be a measure of the time gained or lost due to drift in the standard oscillator 14.

The STD 1 Hz divider chain is identical to the divider chain which produces the NBS 1 Hz. It consists of a divide by 2 divider 108, a divide by 100 divider 110 and dividers 100 and 12 having a variable dividing ratio which is nominally 50,000. The divide by 100 dividers 110 are preset to divide by 100. The divide by 50,000 dividers 112 may be preset with the dividing ratio which is preset into the dividers 106 and the NBS 1 Hz chain upon phase lock being detected between TIME CODE and NBS 1 Hz. However, it is preferable to use the accumulating phase detector 42 and the timing discriminator 44. An exclusive or gate 114 and a counter 116 make up the accumulating phase detector 42. Another JK flip flop provides the time discriminator 44. The counter 116 counts a 50 KHz input from the dividers 110. Each count represents 20 microseconds of phase shift between NBS 1 Hz and STD 1 Hz. The time discriminator flip flop 44 provides an output from its Q output terminal called STD HIGH which is inputted to the processor 50. STD HIGH is high if the rising edge of STD 1 Hz occurs when NBS 1 Hz is high; otherwise, STD HIGH is low. Thus, whether STD HIGH is high or low indicates whether STD 1 Hz is early or late with respect to NBS 1 Hz. The count stored in the counter 116 (the number of 20 microsecond periods which are counted) while STD 1 Hz and NBS 1 Hz are out of phase as indicated by the output of the exclusive or phase detector 114 represents the time displacement between STD 1 Hz and NBS 1 Hz. STD high represents the sense of this displacement, whether early or late. The microprocessor computes the exact dividing ratio and presets the dividers 112 and the STD 1 Hz divider chain 40 accordingly.

After the STD 1 Hz and NBS 1 Hz are in phase with each other by adjustment of the dividers 112, the STD high output of the discriminator flip flop 44 is read by the microprocessor each time a valid frequency measurement has been made; that is after three out of four consecutive thousand second gates result in counts in the 48 bit counter 24 of the frequency controller 16 are less than 1 part in $10^9$ and the three variances have been averaged and the correction inputted to the D/A 90, a time correction value equivalent to one part in $10^9$ of the STD 10 MHz output is added or subtracted from the correction value applied to the D/A 90 depending upon the sense of the STD high output. The oscillator 14 is then offset high to make up for lost time or offset low because it has been too fast. The STD signal is continuously monitored and when there is a cross over between STD 1 Hz and NBS 1 Hz (STD high changing from high to low or vice versa), the time correction is complete and the time correction factor (1 part in $10^9$ in the STD 10 MHz output is removed from the D/A converter 90. The oscillator 14 will then be on frequency with no time offsets. The exclusive or phase detector 114 provides an interrupt INTI to the processor 50, which causes the phase difference counter 116 to be read. This reading is used to detect alarm conditions.

In the event that NBS 1 Hz loses time lock with time code. The alternating cross overs in the NBS high output every 2,049 good edges (level E in the phase lock table) will no longer occur. This indicates loss of time lock. If three steps in the same direction occur after loss of time lock, the time lock is regained by searching in the reverse direction up the table (i.e., E, D, C, . . .). However, the step size is doubled, as shown in the Table, before the level is decreased. This means that larger steps will be taken during the regaining of time lock. If level A is reached loss of time lock is declared.

When a cross over occurs as indicated by a change in the NBS high level from low to high or vice versa, the process proceeds down the table until it again reaches level E and three cross overs are detected. The system is then again in time lock. Only during the time lock condition is the phase difference counter 116 read into the microprocessor. If then there is a phase difference of more than 2 milliseconds, the timing error indicator 118 will indicate a timing error. Another error will be indicated by another indicator 120 when the STD oscillator 114 tuning voltage is at a limit of its automatic adjusting range, as indicated by the digital value which is applied to the D/A 90. It will be apparent that the alarms are inhibited during initial phase locking of the STD 1 Hz and NBS 1 Hz and will be actuated only under true alarm conditions.

From the foregoing description it will be apparent that there has been provided an improved system which provides a disciplined oscillator for use in frequency standards, frequency synthesizers and other applications where precise time bases are needed. Other applications for the herein described system, as well as variations and modifications thereof, within the scope of the invention, will undoubtably suggest themselves to those skilled in the art. Accordingly, the foregoing description should be taken as illustrative and not in a limiting sense.

We claim:

1. A disciplined oscillator system which comprises means for providing constant frequency signals including pulses which are repetitive at fixed intervals of time, standard frequency oscillator means for providing a standard frequency output and having an input for controlling the frequency thereof, frequency controller means responsive to said constant frequency signals for detecting variances in the frequency of said standard frequency output and providing a frequency control signal, time controller means responsive to said pulses for detecting time displacements of said standard frequency output with respect to said pulses for providing a timing control signal, and means responsive to said frequency control signal and to said timing control signal for applying a correction signal to said input.

2. The disciplined oscillator system according to claim 1 further comprising means for detecting when timing errors between said standard frequency output and said pulses are eliminated, and means responsive to the detection of the elimination of said timing errors for inhibiting the generation of said timing control signal.

3. The disciplined oscillator system according to claim 1 further comprising means for detecting said variances in the frequency of said standard frequency output repetitively at successive intervals of time, and means for inhibiting the generation of said frequency control signal unless a plurality of consecutive ones of said variances are each more than one part in $10^9$.

4. The disciplined oscillator system according to claim 3 further comprising means for detecting a variance in frequency of said standard frequency output at any of said successive intervals of time which exceeds the correction range of said means for applying the correction signal, means for detecting a time displacement of said standard frequency output at any of said successive intervals of time which exceeds the correction range of said means for applying said correction signal, and means for indicating an alarm condition in response to the detection of said excessive variance in frequency or time displacement by said last two named detecting means.

5. The disciplined oscillator system according to claim 4 wherein said excessive variance in frequency is a variance which exceeds one part in $10^8$ and said excessive time displacement is a time displacement which exceeds plus or minus 2 milliseconds.

6. The disciplined oscillator system according to claim 1 wherein said means for providing said constant frequency signals comprises radio receiver means responsive to a radio transmission of constant frequency signals modulated with said pulses for providing said constant frequency signals and said pulses.

7. The disciplined oscillator system according to claim 6 wherein said radio receiver means includes circuits tuned to the National Bureau of Standards (NBS) radio station WWVB which provides said constant frequency signals at 60 KHz modulated by time code signals each second which provide said pulses, and said radio receiver means also including means for providing said constant frequency signals at the frequency of said standard oscillator and locked to said 60 KHz signals, and means for demodulating said time code signals to provide said pulses each second.

8. The disciplined oscillator system according to claim 6 further comprising means for selectively operating said time controller means in response to those of said pulses which are substantially free of noise thereby preventing the adjustment of said standard oscillator means except in response to times stable ones of said pulses.

9. The disciplined oscillator system according to claim 8 wherein said selectively operating means also includes means for selecting those of said pulses which are substantially free of intersymbol interference for operating said time controller means.

10. The disciplined oscillator system according to claim 1 wherein said frequency controller means comprises a counter having a capacity to count to a number greater than the resolution in frequency to which said standard frequency output is to be controlled, means responsive to said constant frequency signals for repetitively enabling said counter to count said standard frequency output for an interval upon each repetition sufficient to count a number of cycles of said standard frequency output at least equal to said frequency resolution, and means responsive to the counts stored in said counter for providing said frequency control signal.

11. The disciplined oscillator system according to claim 10 wherein said means responsive to said counts comprises means for detecting when variances in the counts stored in said counter upon each of a plurality of consecutive ones of said repetitions represents at least a certain magnitude of variance, and means responsive to the average of the magnitudes of the variances represented by the counts stored in said counter in said plurality of consecutive ones of said repetitions for providing said frequency control signal.

12. The disciplined oscillator system according to claim 11 wherein said counter has a count capacity of at least $10^{11}$ counts and said standard frequency output and said interval are sufficient to enable the counting of at least $10^{10}$ repetitions of said standard frequency signal.

13. The disciplined oscillator system according to claim 12 wherein said enabling means comprises means for generating a gate signal in response to said constant frequency signal of duration equal to said interval, and means for synchronously gating said standard frequency output into said counter during each said repetition in response to said gate signal.

14. The disciplined oscillator system according to claim 13 wherein said means for providing said frequency control signal includes means for providing said frequency control signal as a multi-bit digital signal, and means for converting said digital signal into an analog signal having at least as many parts as the product of the tuning range of said standard frequency oscillator and the duration of said gate signal.

15. The disciplined oscillator system according to claim 13 wherein said standard frequency output and said constant frequency output are each nominally 10 MHz, said counter is a binary counter of at least 48 bits capacity, and said gate signal is 1,000 seconds in duration and said repetition occurs at intervals of 5 milliseconds.

16. The disciplined oscillator system according to claim 13 wherein said means for providing said gate signal and providing said frequency control signal comprises a microprocessor.

17. The disciplined oscillator system according to claim 1 wherein said time controller means comprises means responsive to said constant frequency signals and said fixed interval pulses for providing a train of reference pulses time-locked to said fixed interval pulses, and means responsive to the phase difference between said fixed interval pulses and said reference pulses for producing said timing control signal.

18. The disciplined oscillator system according to claim 17 wherein said phase difference responsive means includes means for deriving a plurality of successive outputs representing the relative times of occurrence (early and late) of a plurality of successive ones of said reference pulses and said fixed interval pulses, and means for detecting when the number of outputs in said plurality of one type exceeds the number of outputs of the other type to provide an output representing the sense of said phase difference, said phase difference responsive means comprising means for producing a timing correction signal for an incremental offset in frequency of said standard oscillator means in a sense corresponding to the sense of said phase difference, as said timing control signal.

19. The disciplined oscillator system according to claim 18 further comprising means responsive to a change in the sense of said phase difference representing output for inhibiting the generation of said timing control signal by said phase difference responsive means.

20. The disciplined oscillator system according to claim 17 further comprising means for selecting those of said fixed interval pulses which are substantially free from time jitter to operate said means for producing said train of reference pulses.

21. The disciplined oscillator system according to claim 17 wherein said means for producing said reference pulses comprises means for dividing said constant frequency signals in frequency to the repetition frequency of said fixed interval pulses, means for detecting the sense (early and late) and magnitude of the difference of the relative times of occurrence of said fixed interval pulses and said reference pulses from said dividing means for changing the dividing ratio of said dividing means to time lock said reference pulses to said fixed interval pulses.

22. The disciplined oscillator system according to claim 21 further comprising means for selecting those of said fixed interval pulses which are substantially free from time jitter for operating said means for detecting the sense and magnitude of the relative times of occurrence of said fixed interval and reference pulses.

23. The disciplined oscillator system according to claim 22 wherein said means for detecting the sense and magnitude of difference in relative time of occurrence of said fixed and reference pulses includes means responsive to the relative times of occurrence of said reference and fixed interval pulses for producing first outputs representing whether said reference pulses are early with respect to said fixed interval pulses and second outputs when said reference pulses are late with respect to said fixed intervals pulses, means for counting said outputs during predetermined time intervals for increasing said dividing ratio when said first outputs exceed said second outputs and for a decreasing said dividing ratio when said second outputs exceed said first outputs.

24. The disciplined oscillator system according to claim 23 wherein microprocessor means is included in said means for changing the dividing ratio of said dividing means and said means for producing said timing control signal.

25. In a disciplined oscillator system utilizing a constant frequency reference signal and having standard frequency oscillator means for providing a standard frequency output which is variable in response to a frequency control signal, frequency controller means comprising a counter having a capacity to count to a number greater than the resolution in frequency to which said standard frequency output is to be controlled, means responsive to said constant frequency signal for repetitively enabling said counter to count each repetition of said standard frequency output for an interval changed upon each repetitive enablement sufficient to count a number of cycles of said standard frequency output at least equal to said frequency resolution, and means responsive to the counts stored in said counter for providing said frequency control signal.

26. The system according to claim 25 wherein said means responsive to said counts comprises means for detecting when variances in the counts stored in said counter upon each of a plurality of consecutive ones of said repetitions represents at least a certain magnitude of variance, and means responsive to the average of the magnitudes of the variances represented by the counts stored in said counter in said plurality of consecutive ones of said repetitions for providing said frequency control signal.

27. The system according to claim 26 wherein said counter has a count capacity of at least $10^{11}$ counts and said standard frequency output and said interval are sufficient to enable the counting of at least $10^{10}$ repetitions of said standard frequency signal.

28. The system according to claim 27 wherein said enabling means comprises means for generating a gate signal in response to said constant frequency signal of duration equal to said interval, and means for synchronously gating said standard frequency output into said counter during each said repetition in response to said gate signal.

29. The system according to claim 28 wherein said means for providing said frequency control signal includes means for providing said frequency control signal as a multi-bit digital signal, and means for converting said digital signal into an analog signal having at least as many parts as the product of the tuning range of said standard frequency oscillator and the duration of said gate signal.

30. The disciplined oscillator system according to claim 28 wherein said standard frequency output and said constant frequency output are each nominally 10 MHz, said counter is a binary counter of at least 48 bits capacity, and said gate signal is 1,000 seconds in duration and said repetition occurs at intervals of 5 milliseconds.

31. The disciplined oscillator system according to claim 28 wherein said means for providing said gate signal and providing said frequency control signal comprises a microprocessor.

32. In a disciplined oscillator system utilizing a source of pulses repetitive at fixed intervals of time and having standard oscillator means having a standard frequency output which is variable in frequency in response to a control signal, time controller means comprising means responsive to said standard frequency output and said fixed interval pulses for providing a train of reference pulses time-locked to said fixed interval pulses, and means responsive to the phase difference between said fixed interval pulses and said reference pulses for producing said control signal.

33. The system according to claim 32 wherein said phase difference responsive means includes means for deriving a plurality of successive outputs representing the relative times of occurrence (early and late) of a plurality of successive ones of said reference pulses and said fixed interval pulses, and means for detecting when the number of outputs in said plurality of one type exceeds the number of outputs of the other type to provide an output representing the sense of said phase difference, said phase difference responsive means comprising means for producing a timing correction signal for an incremental offset in frequency of said standard oscillator means in a sense corresponding to the sense of said phase difference, as said control signal.

34. The system according to claim 32 further comprising means responsive to a change in the sense of said phase difference representing output for inhibiting the generation of said timing control signal by said phase difference responsive means.

35. The system according to claim 32 further comprising means for selecting those of said fixed interval pulses which are substantially free from time jitter to operate said means for producing said train of reference pulses.

36. The system according to claim 32 wherein said means for producing said reference pulses comprises means for dividing said constant frequency signals in frequency to the repetition frequency of said fixed interval pulses, means for detecting the sense (early and late) and magnitude of the difference of the relative times of occurrence of said fixed interval pulses and said reference pulses from said dividing means for changing the dividing ratio of said dividing means to time lock said reference pulses to said fixed interval pulses.

37. The system according to claim 36 further comprising means for selecting those of said fixed interval pulses which are substantially free from time jitter for operating said means for detecting the sense and magnitude of the relative times of occurrence of said fixed interval and reference pulses.

38. The system according to claim 37 wherein said means for detecting the sense and magnitude of difference in relative time of occurrence of said fixed and reference pulses includes means responsive to the relative times of occurrence of said reference and fixed interval pulses for producing first outputs representing whether said reference pulses are early with respect to said fixed interval pulses and second outputs when said reference pulses are late with respect to said fixed intervals pulses, means for counting said outputs during predetermined time intervals for increasing said dividing ratio when said first outputs said representing said early reference pulses exceed said second outputs and for a decreasing said dividing ratio when said second outputs representing the late reference pulses exceed said first outputs.

39. The system according to claim 38 wherein microprocessor means is included in said means for changing the dividing ratio of said dividing means and said means for producing said timing control signal.

* * * * *